United States Patent
Kurz et al.

(10) Patent No.: US 10,074,593 B2
(45) Date of Patent: Sep. 11, 2018

(54) SHUNT RESISTOR INTEGRATED IN A CONNECTION LUG OF A SEMICONDUCTOR MODULE AND METHOD FOR DETERMINING A CURRENT FLOWING THROUGH A LOAD CONNECTION OF A SEMICONDUCTOR MODULE

(71) Applicant: Infineon Technologies AG, Neubiberg (DE)

(72) Inventors: Thorsten Kurz, Bad Sassendorf (DE); Andreas Schulz, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 1007 days.

(21) Appl. No.: 13/937,745

(22) Filed: Jul. 9, 2013

(65) Prior Publication Data
US 2014/0035605 A1   Feb. 6, 2014

(30) Foreign Application Priority Data
Jul. 9, 2012 (DE) .................. 10 2012 211 924

(51) Int. Cl.
*H01L 23/48* (2006.01)
*G01R 27/02* (2006.01)
(Continued)

(52) U.S. Cl.
CPC .............. *H01L 23/48* (2013.01); *G01R 27/02* (2013.01); *H01L 23/24* (2013.01);
(Continued)

(58) Field of Classification Search
CPC ......... G01R 27/02; G01R 1/203; H01L 23/48; H01L 23/647; H01L 25/072; H01L 25/16;
(Continued)

(56) References Cited

U.S. PATENT DOCUMENTS 4,763,064 A * 8/1988 Johnson ........................ 324/447
4,783,064 A * 11/1988 Hayashi ................... B65H 3/24
271/131
(Continued)

FOREIGN PATENT DOCUMENTS

| DE | 102007056581 A1 | 6/2009 |
|---|---|---|
| EP | 2015361 A2 | 1/2009 |
| JP | 2008205058 A | 9/2008 |

*Primary Examiner* — Jermele M Hollington
*Assistant Examiner* — Brent J Andrews
(74) *Attorney, Agent, or Firm* — Murphy, Bilak & Homiller, PLLC (57) ABSTRACT

A semiconductor module includes a housing, a circuit carrier having an insulation carrier and a metallization layer applied to a side of the insulation carrier, and a connection lug having a first and second load connection sections and a shunt resistor region. The shunt resistor region is electrically arranged between the first and second load connection sections and connected in series with the first and second load connection sections. The shunt resistor region has an ohmic resistance with a temperature coefficient having an absolute value of less than 0.00002/K at a temperature of 20° C. The connection lug in the region of the second load connection section is electrically conductively connected to a first section of the metallization layer by a first cohesive connection. The first load connection section is led out from the housing and has a free end arranged on the outer side of the housing.

19 Claims, 4 Drawing Sheets

(51) Int. Cl.
    *H01L 23/24*         (2006.01)
    *H01L 23/373*      (2006.01)
    *H01L 23/498*      (2006.01)
    *H01L 25/07*        (2006.01)
    *H01L 23/057*      (2006.01)
    *H01L 23/053*      (2006.01)
    *G01R 1/20*         (2006.01)
    *H01L 23/00*        (2006.01)

(52) U.S. Cl.
    CPC .... *H01L 23/3735* (2013.01); *H01L 23/49811* (2013.01); *H01L 25/072* (2013.01); *G01R 1/203* (2013.01); *H01L 23/053* (2013.01); *H01L 23/057* (2013.01); *H01L 24/73* (2013.01); *H01L 2224/32225* (2013.01); *H01L 2224/48091* (2013.01); *H01L 2224/48227* (2013.01); *H01L 2224/48472* (2013.01); *H01L 2224/49111* (2013.01); *H01L 2224/49175* (2013.01); *H01L 2224/73265* (2013.01); *H01L 2924/1301* (2013.01); *H01L 2924/13055* (2013.01); *H01L 2924/13062* (2013.01); *H01L 2924/13091* (2013.01); *H01L 2924/181* (2013.01); *H01L 2924/3011* (2013.01)

(58) Field of Classification Search
    CPC . H01L 25/18; H01L 23/485; H01L 23/49548; H01L 23/3735; H01L 23/24; H01L 23/49811; H05K 1/181
    USPC .................................. 324/713, 731; 257/536
    See application file for complete search history.

(56) References Cited

U.S. PATENT DOCUMENTS

| | | | |
|---|---|---|---|
| 6,313,598 B1 | 11/2001 | Tamba et al. | |
| 2008/0224634 A1* | 9/2008 | Scilia | 315/294 |
| 2011/0033985 A1* | 2/2011 | Udompanyavit | H01L 23/49548 438/123 |
| 2011/0310568 A1* | 12/2011 | Hong | G01R 1/203 361/737 |

\* cited by examiner

SHUNT RESISTOR INTEGRATED IN A CONNECTION LUG OF A SEMICONDUCTOR MODULE AND METHOD FOR DETERMINING A CURRENT FLOWING THROUGH A LOAD CONNECTION OF A SEMICONDUCTOR MODULE

PRIORITY CLAIM

This application claims priority to German Patent Application No. 10 2012 211 924.8, filed on 9 Jul. 2012, the content of said German application incorporated herein by reference in its entirety.

TECHNICAL FIELD

The invention relates to semiconductor modules.

BACKGROUND

Semiconductor modules usually contain one or more semiconductor chips, via the load paths of which high currents flow. These currents are measured by means of a shunt resistor. Shunt resistors of this type are usually mounted on a circuit carrier on which one or more of the semiconductor chips are also mounted. In this case, a sufficiently large placement area on the circuit carrier must be kept available for the shunt resistor. This increases the production costs of the module particularly when the circuit carrier is a ceramic-based circuit carrier, which is generally very expensive.

SUMMARY

A semiconductor module is provided in which a current that occurs in the semiconductor module is determined in a cost-effective manner. A corresponding method is provided for determining such a current.

According to an embodiment of a semiconductor module, the semiconductor module comprises a circuit carrier, a housing and a connection lug. The circuit carrier comprises an insulation carrier having a top side, to which a metallization layer is applied. The insulation carrier can be, for example, a flat ceramic lamina. Furthermore, the top side of the insulation carrier can be planar.

The connection lug contains an integrated shunt resistor. For this purpose, the connection lug has a first load connection section and a second load connection section, and also a shunt resistor region. The shunt resistor region is electrically arranged between the first load connection section and the second load connection section and is electrically conducted in series therewith.

The shunt resistor region additionally has an ohmic resistance with a temperature coefficient whose absolute value at a temperature of 20° C. is less than 0.00002/K. In the region of the second load connection section, the connection lug is electrically conductively connected to a first section of the metallization layer by means of a first cohesive connection. The first load connection section is led out from the housing and has a free end arranged on the outer side of the housing. By way of example, an external load or a supply voltage for supplying the semiconductor module can be connected to the free end. By virtue of the integration of the shunt resistor region into a connection lug, the mounting of a separate shunt resistor on the circuit carrier can be avoided and placement area on the circuit carrier can thereby be saved. Optionally, the shunt resistor region can also have an electrical resistivity that is greater than the electrical resistivity of both the first load connection section and the second load connection section.

In the case of a semiconductor module of this type, the current through the load connection can be determined by the current flowing through the load connection being deduced from the voltage dropped across the shunt resistor region in conjunction with the ohmic resistance of the shunt resistor region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
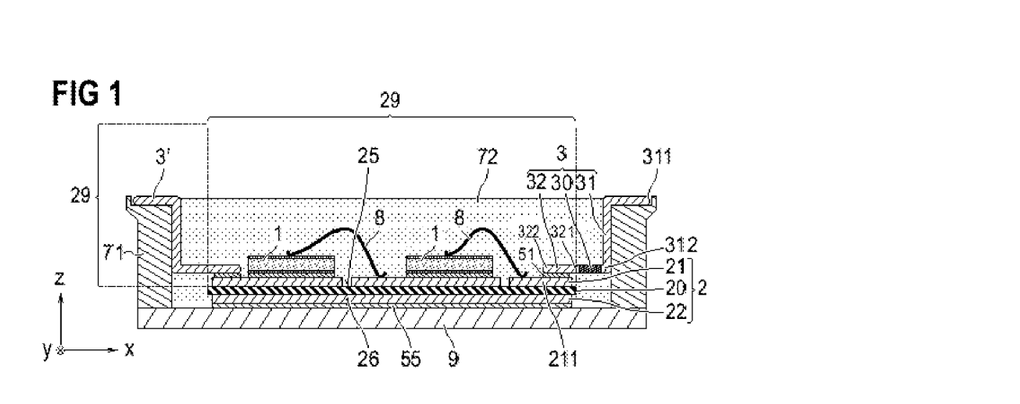
FIG. 1 shows a vertical sectional view through a semiconductor module having a connection lug, into which a shunt resistor is integrated and which is cohesively connected to a metallization of a circuit carrier by means of a connecting layer.

FIG. 1 shows a vertical sectional view through a semiconductor module. The module includes a circuit carrier 2, on which one or more semiconductor chips 1 are mounted. The circuit carrier 2 comprises an insulation carrier 20, and also an upper metallization layer 21 applied to a top side 25 of the insulation carrier 20. As is shown, the upper metallization layer 21 can optionally be structured to form conductor tracks and/or conductor areas. In this case, different conductor tracks and/or conductor areas can be electrically isolated from one another. Optionally, the insulation carrier 20 can have a lower metallization layer 22 on its bottom side 26 opposite the top side 25. The lower metallization layer 22 can be structured or—as illustrated—unstructured. Likewise optionally, the circuit carrier 2 can be connected to a solid baseplate 9, for example a plate composed of copper or of thinly coated copper, by means of a connecting layer 55. The connecting layer 55 can be a solder layer, a sintering layer or an adhesive layer. However, if there is no baseplate 9 present in the semiconductor module, the circuit carrier 2 forms an outer surface of the semiconductor module.

The internal interconnection of the semiconductor module can be effected in particular using the conductor tracks and/or conductor areas in the upper metallization layer 21. Further electrical connecting elements 8 can likewise be provided for this purpose, as necessary. These further connecting elements 8 can be, for example, bonding wires, bonding ribbons or connecting plates.

Connection lugs 3 and 3' are provided for the external wiring of the semiconductor module, the connection lugs 3, 3' being accessible from the outer side of the module. The connection lugs 3, 3' can be used, for example, to connect an external load to the semiconductor module or to feed a supply voltage to the semiconductor module. In order to determine an electric current that flows through the connection lug 3 during the operation of the semiconductor module, the connection lug 3 has an integrated shunt resistor region 30 having an ohmic resistance whose temperature coefficient at a temperature of 20° C. is less than 0.00002/K. Suitable materials for the shunt resistor region 30 are, for example, alloys comprising 53 atom % to 57 atom % copper, 43 atom % to 45 atom % nickel and 0.5 atom % to 1.2 atom % manganese. The remainder can consist partly or completely of iron. A further suitable alloy can contain 82 atom % to 84 atom % copper, 2 atom % to 4 atom % nickel and 12 atom % to 15 atom % manganese. Yet another suitable alloy consists of approximately 84 atom % copper, 13 atom % manganese and 3 atom % aluminum.

The shunt resistor region 30 is arranged between a first load connection section 31 and a second load connection section 32 of the connection lug 3 and is electrically connected in series with the load connection sections 31 and 32. The shunt resistor region 30 has an electrical resistivity that is greater than the electric resistivities of both the first load connection section 31 and the second load connection section 32. In the case of a current through the connection lug 3, an electrical voltage is dropped across the shunt resistor region 30, from which voltage in conjunction with the (known) ohmic resistance of the shunt resistor region 30 the current through the connection lug 3 can be determined with high accuracy in a simple manner according to Ohm's law.

The first load connection section 31 of the connection lug 3 has a first end 311 and a second end 312. The second load connection section 32 of the connection lug 3 likewise has a first end 321 and a second end 322. The first load connection section 31 is led out from a housing of the semiconductor module, such that the first end 311 is accessible from the outer side of the module and can be connected to a module-external load or to a module-external supply voltage for supplying the module. For this purpose, the first load connection section 31 can optionally have a screw-on opening at its free end 311.

In the example shown, the housing of the module is formed by a ring-shaped housing frame 71, and also by a potting compound 72 filled into the housing frame 71. Optionally, a housing cover can also be provided at the side of the at least one semiconductor chip 1 which faces away from the circuit carrier 2. In this case, the first load connection section 31 could also be led through a gap between the housing frame 71 and the housing cover or through the housing cover itself. Independently of whether or not a housing cover is present, the connection lug 3 could also be led through the housing frame 71. For this purpose, the connection lug 3 could be inserted into an insert channel of the housing frame 71. Yet another possibility includes producing the housing frame 71 using injection-molding technology and in the process concomitantly injection-molding the connection lug 3 into the housing frame 71. Independently of the configuration of the module housing, the first load connection section 31 is led out from the housing, such that the first end 311 of the first load connection section 31 forms a free end of the connection lug 3 that is accessible from the outer side of the module.

In the region of the second load connection section 32, the connection lug 3 is connected to a first section 211 of the upper metallization layer 21 by means of a first cohesive connection. In the embodiment in accordance with FIG. 1, the first cohesive connection is realized by means of a first connecting layer 51 which makes contact directly with both the second load connection section 32 and the first section 211 of the upper metallization layer 21. The first connecting layer 51 can be embodied for example as a solder layer or as a sintering layer. In the case of a sintering layer, the first connecting layer 51 can contain e.g. silver or consist of silver.

Figure 2:
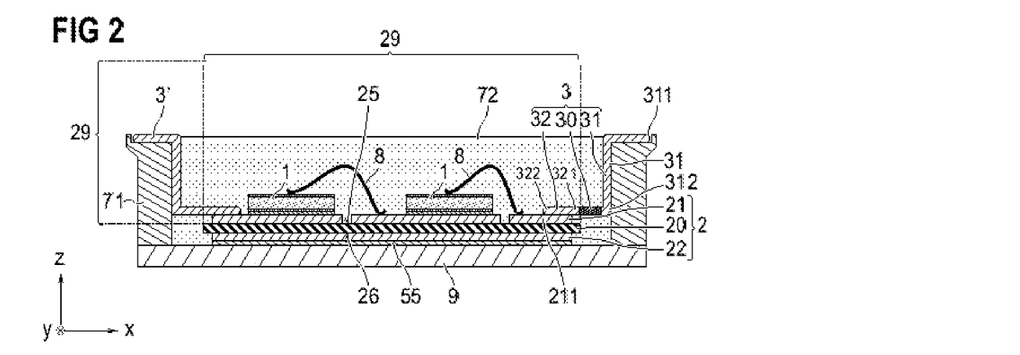
FIG. 2 shows a vertical sectional view through a semiconductor module that differs from the semiconductor module in accordance with FIG. 1 in that the connection lug is directly connected to the metallization of the circuit carrier.

In a departure from this, the connection lug 3 in the exemplary embodiment in accordance with FIG. 2 is directly cohesively connected to the upper metallization layer 21, i.e. the cohesive connection between the second load connection section 32 and the first section 211 of the upper metallization layer 312 is a direct connection that makes contact with the second load connection section 32 and the first section 211 of the upper metallization layer 312. Such a connection can be produced for example by welding or bonding, in particular by ultrasonic bonding.

Figure 3:
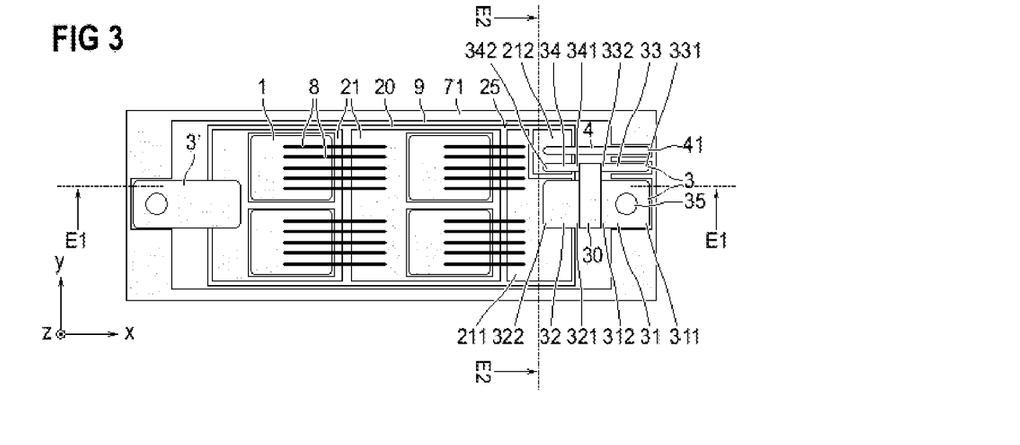
FIG. 3 shows a plan view of the semiconductor modules in accordance with FIGS. 1 and 2, wherein a potting compound has been removed, and wherein the connection lug has a load connection section and a sense connection section, which are cohesively connected to different sections of the metallization of the circuit carrier.

FIG. 3 shows a plan view corresponding to a plan view both of the semiconductor module according to FIG. 1 and of the semiconductor module according to FIG. 2. The potting compound 72 is not illustrated, however, in order to be able to show the components of the semiconductor module that are embedded therein. The illustration in accordance with FIGS. 1 and 2 corresponds to the sectional plane E1-E1 depicted in FIG. 3.

In the embodiment in accordance with FIG. 3, the connection lug 3 has a first sense connection section 33 and a second sense connection section 34. The first sense connection section 33 has a first end 331 and a second end 332 opposite the first end 331. Correspondingly, the second sense connection section 34 has a first end 341 and an end 342 opposite the first end 341.

The first end 321 of the second load connection section 32 and the first end 341 of the second sense connection section 34 are cohesively connected to the shunt resistor section 30 on the same side thereof. Moreover, the second end 312 of the first load connection section 31 and the second end 332 of the first sense connection section 33 are cohesively connected to the shunt resistor section 30 on the same side thereof. The cohesive connections between the shunt resistor section 30 and each of the connection sections 31, 32, 33, 34 can be effected by welding, for example. Suitable welding techniques are e.g. electron beam welding or laser welding.

Based on the embodiment shown, the connection lug 3 can be used to determine a current via the load connection sections 31 and 32 with the aid of a conventional four-conductor measurement. In this case, the sense connection sections 33 and 34 serve as voltage taps for determining the voltage dropped across the shunt resistor region 30. The measurement of the voltage is in this case effected at high impedance in order not to corrupt the measurement result.

For further electrical interconnection, the connection lug 3, in the region of its second sense connection section 34, is connected to a second section 212 of the upper metallization layer 21 by means of a second cohesive connection. A connecting technique used in this case can be the same connecting technique as is also used for producing the first cohesive connection of the second load connection section 32 to the first section 211 of the upper metallization layer 21. The sections 211 and 212 are separate sections of the upper metallization layer 21.

If the electrical potential of the shunt resistor region 30 tapped off by the second sense connection section 34 is intended to be led out from the semiconductor module, a connecting conductor 4 can be used for this purpose. The connecting conductor 4 can likewise be a connection lug, e.g. an angular plate, which is electrically conductively connected to the second section 212. The connecting conductor 4 can additionally have a free end 41 that is led out from the housing of the semiconductor module and thus accessible from the outer side of the module.

Figure 4:
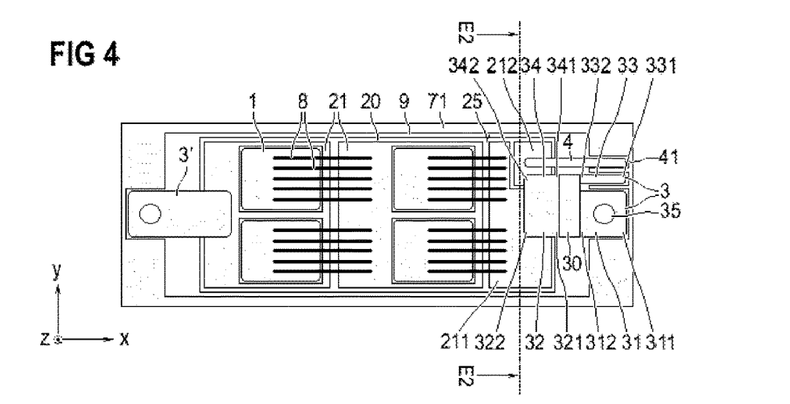
FIG. 4 shows a plan view of an alternative configuration of the semiconductor modules in accordance with FIGS. 1 and 2, in which a load connection section of the connection lug is in each case cohesively connected to two separate sections of the metallization layer.

A modification of the arrangement in accordance with FIG. 3 is shown in FIG. 4. In this arrangement, the second sense connection section 34 is part of the second load connection section 32. Accordingly, the connection lug 3, in the region of the second load connection section 32, is electrically conductively connected both to the first section 211 of the upper metallization layer 21 by means of a first cohesive connection and to the second section 212 of the upper metallization layer 21 by means of a third cohesive connection. In this case, the first and third cohesive connections can be configured, independently of one another, like the first cohesive connection explained with reference to FIGS. 1 and 2. In particular, the same connecting techniques mentioned there can be used and combined arbitrarily with one another.

Figure 5:
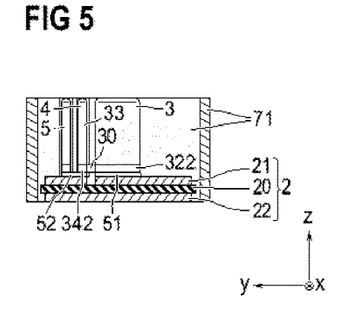
FIG. 5 shows a vertical sectional view through a semiconductor module constructed in accordance with FIGS. 1 and 3.
Figure 6:
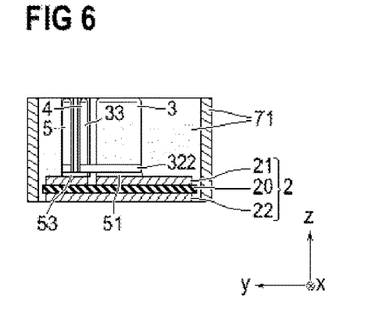
FIG. 6 shows a vertical sectional view through a semiconductor module constructed in accordance with FIGS. 1 and 4.
Figure 7:
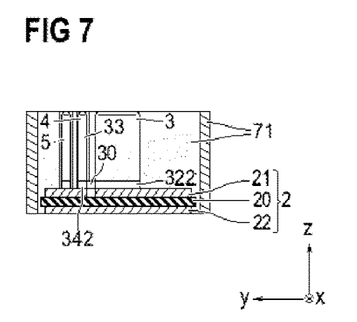
FIG. 7 shows a vertical sectional view through a semiconductor module constructed in accordance with FIGS. 2 and 3.
Figure 8:
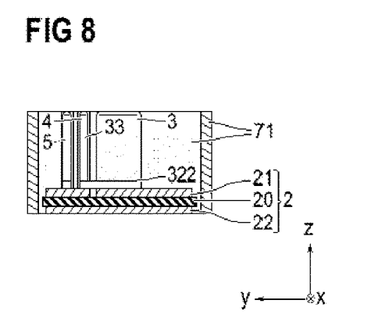
FIG. 8 shows a vertical sectional view through a semiconductor module constructed in accordance with FIGS. 2 and 4.

FIGS. 5 to 8 show views of the semiconductor modules of FIGS. 3 and 4 in each case in a sectional plane E2-E2. Here the arrangement in accordance with FIG. 5 is constructed according to FIGS. 1 and 3, the arrangement in accordance with FIG. 6 is constructed according to FIGS. 1 and 4, the arrangement in accordance with FIG. 7 is constructed according to FIGS. 2 and 3, and the arrangement in accordance with FIG. 8 is constructed according to FIGS. 2 and 4. The potting compound 72 (see FIGS. 1 and 2) is not illustrated in FIGS. 5 to 8 for ease of illustration.

Figure 9:
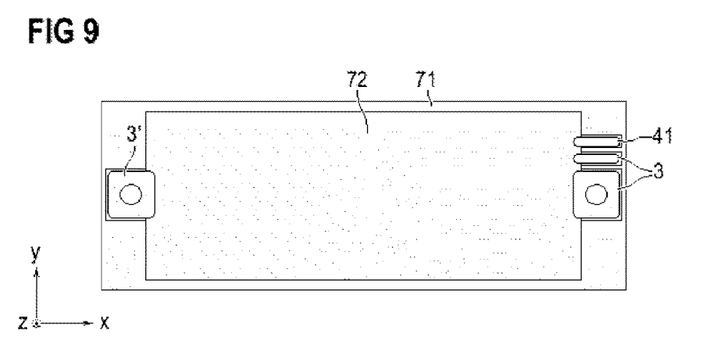
FIG. 9 shows a plan view of a semiconductor module in accordance with FIG. 1 or 2.

FIG. 9 shows a plan view of the arrangements in accordance with FIGS. 3 and 4 after the potting compound 72 has been filled into the housing frame 71.

Figure 10:
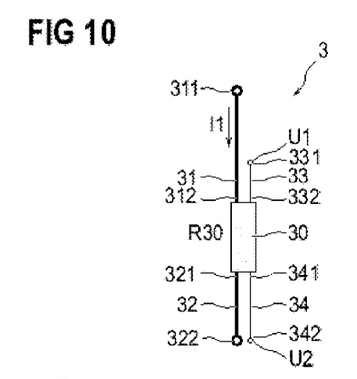
FIG. 10 shows a circuit diagram of a connection lug with an integrated shunt resistor in accordance with the construction shown in FIGS. 3, 5, 7.
Figure 11:
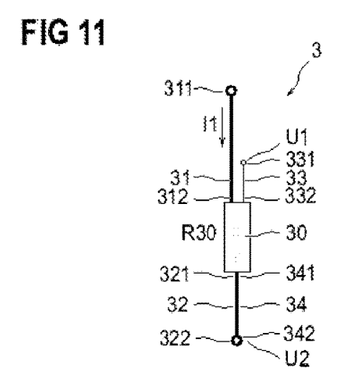
FIG. 11 shows a circuit diagram of a connection lug with an integrated shunt resistor in accordance with the construction shown in FIGS. 4, 6, 8.

FIG. 10 shows a circuit diagram of a connection lug 3 such as the kind previously explained with reference to FIGS. 3, 5 and 7. The connection lug 3 according to this embodiment is embodied as a four-conductor system. The shunt resistor section 30 has an ohmic resistance R30 whose temperature coefficient at a temperature of 20° C. is less than 0.00002/K. An electric current I1 that flows through the first load connection section 31 and the second load connection section 32 during the operation of the semiconductor module generates a voltage drop across the shunt resistor section 30. This voltage drop can be tapped off by the sense connection sections 33 and 34. In this case, an electrical potential U1 is present at the first sense connection section 33 and a second electrical potential U2 is present at the second sense connection section 34. Consequently, the current I1 can be determined from the quotient (U1-U2)/R30 in a known manner according to Ohm's law. The circuit symbol in accordance with FIG. 11 correspondingly shows a connection lug 3 such as the kind previously explained with reference to FIGS. 4, 6 and 8.

Optionally, the shunt resistor region 30 can have a resistivity of at least $40*10^{-8}$ Ω·m (Ohm meter) at a temperature of 20° C.

The saving of placement area on the circuit carrier 2 by virtue of the integration of the shunt resistor region 30 into a connection lug 3 is based, inter alia, on the fact that the shunt resistor region 30, as shown in the examples, is arranged completely or else at least partly outside a spatial region 29 (see FIGS. 1, 2 and 12) that is situated, proceeding from the planar top side 25 of the insulation carrier 20, perpendicularly above the top side 25 and within the lateral edges of the insulation carrier 20 and extends at least to above the semiconductor module.

In the case of a semiconductor module as described herein, there can be an electrically conductive connection between the shunt resistor region 30 and the free end 311 of the first load connection section 31, the electrically conductive connection being produced without the use of bonding wires. This electrical connection can have only a single joint formed by a cohesive connection between the shunt resistor region 30 and the first load connection section 31.

Figure 12:
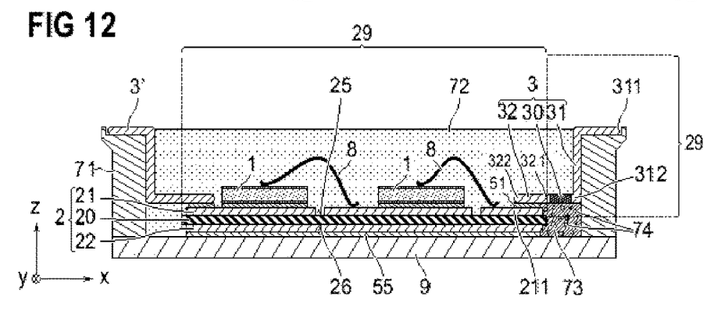
FIG. 12 shows a vertical sectional view through a semiconductor module that differs from the semiconductor module in accordance with FIG. 1 in that a heat conducting medium is introduced between the connection lug and a baseplate of the semiconductor module and which makes contact with both the shunt resistor region and the baseplate.

In accordance with a further aspect, as illustrated in FIG. 12, the heat loss arising in the shunt resistor section 30 can be dissipated towards the baseplate 9 with the aid of a dielectric heat conducting material 73. For this purpose, the heat conducting material 73 is introduced between the connection lug 3 and the baseplate 9 in such a way that it makes contact directly with both the connection lug 3 and the baseplate 9. In this case, the heat conducting material 73 can, in particular, also make contact directly with the shunt resistor section 30.

The heat conducting material 73 can be, for example, a plastic or adhesive. In order to achieve a high thermal conductivity of the heat conducting material 73, the heat conducting material 73 can optionally be filled with highly thermally conductive granules 74 such as grains or a powder. Suitable materials for the thermally conductive granules 74 are ceramic and/or glass, for example. The heat conducting material 73 can have, for example, a thermal conductivity of greater than or equal to 0.8 W/(m·K).

The use of a heat conducting material 73 has been described for a semiconductor module having the construction explained with reference to FIG. 1. However, the heat conducting material 73 can also be used in the same way in all the other semiconductor modules explained, provided that they have a baseplate 9.

Figure 13:
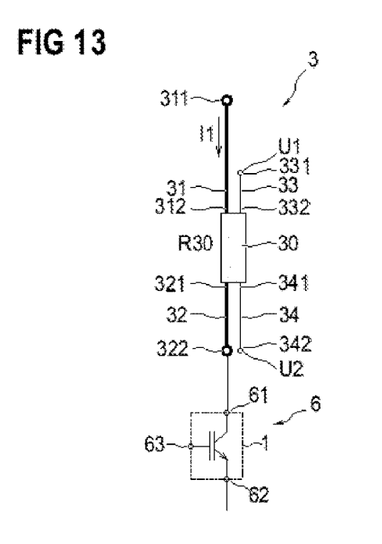
FIG. 13 shows a circuit diagram of a shunt resistor that is electrically connected in series with a load path of a controllable semiconductor component.
Figure 14:
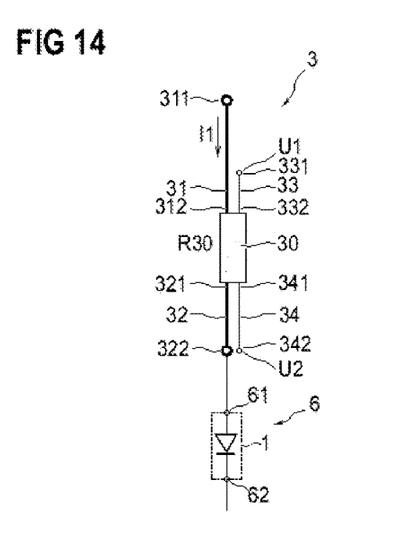
FIG. 14 shows a circuit diagram of a shunt resistor that is electrically connected in series with a load path of a diode.

As is furthermore shown by way of example in FIGS. 13 and 14, in all configurations of the invention a shunt resistor region 30 can be electrically connected in series with a load path of a semiconductor chip 1. In this sense, in the case of a semiconductor chip 1 containing a semiconductor component 6 and—as shown in FIG. 13—having a control input 63 (e.g. a gate connection or a base connection), "load path" is understood to mean an electrical path which is formed between two load connections 61 and 62 of the semiconductor component 6 and which can be driven by the control input 63. Such a controllable semiconductor component 6 can be, for example, a MOSFET (Metal Oxide Semiconductor Field Effect Transistor), an IGBT (Insulated Gate Field Effect Transistor), a JFET (Junction Field Effect Transistor), a thyristor, etc. The two load connections 61 and 62 can then be drain and source, source and drain, emitter and collector, or collector and emitter. If the semiconductor component 6 is otherwise—as shown in FIG. 14—not controllable, as is the case for a diode, for example, the two load connections 61 and 62 can be anode and cathode or cathode and anode. In this case, the second load connection section 32 can optionally be electrically connected between the shunt resistor region 30 and the load path.

What is claimed is:

1. A semiconductor module, comprising:
    a circuit carrier comprising an insulation carrier and a metallization layer applied to a first side of the insulation carrier;
    a connection lug comprising a first load connection section, a second load connection section and a shunt resistor region electrically arranged between the first load connection section and the second load connection section and connected in series with the first load connection section and the second load connection; and
    a housing,
    wherein the shunt resistor region has an ohmic resistance with a temperature coefficient having an absolute value of less than 0.00002/K at a temperature of 20° C.,
    wherein the connection lug in the region of the second load connection section is electrically conductively connected to a first section of the metallization layer by a first cohesive connection,
    wherein the first load connection section is led out from the housing and has a free end arranged on the outer side of the housing.

2. The semiconductor module of claim 1, wherein the shunt resistor region has a greater electrical resistivity than the first load connection section and the second load connection section.

3. The semiconductor module of claim 1, wherein the shunt resistor region has a resistivity of at least $40*10^{-8}$ Ω·m at a temperature of 20° C.

4. The semiconductor module of claim 1, wherein the first side of the insulation carrier is planar, wherein the shunt resistor region is arranged completely or at least partly outside a spatial region that is situated perpendicularly above the first side of the insulation carrier and within lateral edges of the insulation carrier, and wherein the shunt resistor region extends at least to above the semiconductor module.

5. The semiconductor module of claim 1, wherein:

the first cohesive connection is a bonded or welded connection and the second load connection section is directly connected to the first section of the metallization layer; or the first cohesive connection is a soldered or sintered connection and the second load connection section is connected to the first section of the metallization layer indirectly by a first connecting layer comprising a solder layer or a sintering layer, and the first connecting layer directly makes contact with both the first section of the metallization layer and the second load connection section.

6. The semiconductor module of claim 1, wherein the free end of the first load connection section has a screw-on opening.

7. The semiconductor module of claim 1, wherein the insulation carrier is a ceramic lamina.

8. The semiconductor module of claim 1, further comprising an electrically conductive connection between the shunt resistor region and the free end of the first load connection section, the electrically conductive connection being devoid of bonding wires.

9. The semiconductor module of claim 1, further comprising an electrically conductive connection between the shunt resistor region and the free end of the first load connection section, the electrically conductive connection having only a single joint formed by a cohesive connection between the shunt resistor region and the first load connection section.

10. The semiconductor module of claim 1, further comprising a sense connection section electrically conductively connected to the shunt resistor region on a same side of the shunt resistor region as the first load connection section.

11. The semiconductor module of claim 10, wherein the sense connection section is led out from the housing such that a free end of the first sense connection section is disposed on an outer side of the housing and forms an external connection of the semiconductor module.

12. The semiconductor module of claim 1, further comprising a sense connection section electrically conductively connected to the shunt resistor region on a same side of the shunt resistor region as the second load connection section.

13. The semiconductor module of claim 12, wherein the sense connection section is electrically conductively connected to a second section of the metallization layer cohesively in a region of the sense connection section by a second cohesive connection, and wherein:

the second cohesive connection is a bonded or welded connection and the sense connection section is directly connected to the second section of the metallization layer; or the second cohesive connection is a soldered or sintered connection and the connection section is connected to the second section of the metallization layer indirectly by a second connecting layer comprising a solder layer or a sintering layer, and the second connecting layer directly contacts the second section of the metallization layer and the sense connection section.

14. The semiconductor module of claim 1, wherein the second load connection section is electrically conductively connected to a second section of the metallization layer by an additional cohesive connection, and wherein:

the additional cohesive connection is a bonded or welded connection and the second load connection section is directly connected to the second section of the metallization layer; or the additional cohesive connection is a soldered or sintered connection and the second load connection section is connected to the second section of the metallization layer indirectly by a third connecting layer comprising a solder layer or a sintering layer, and the third connecting layer directly contacts the second section of the metallization layer and the second load connection section.

15. The semiconductor module of claim 14, further comprising a connecting conductor electrically conductively connected to the second section of the metallization layer, wherein the circuit carrier and the shunt resistor region are arranged in the housing and from which the connecting conductor is led out such that a free end of the connecting conductor is disposed on an outer side of the housing and forms an external connection of the semiconductor module.

16. The semiconductor module of claim 1, further comprising a semiconductor chip comprising a semiconductor component having a load path electrically connected in series with the shunt resistor region.

17. The semiconductor module of claim 16, wherein the second load connection section is electrically connected between the shunt resistor region and the load path.

18. A method for determining a current flowing through a load connection of a semiconductor module comprising a circuit carrier having an insulation carrier and a metallization layer applied to a first side of the insulation carrier, a connection lug comprising a first load connection section, a second load connection section and a shunt resistor region electrically arranged between the first load connection section and the second load connection section and connected in series with the first load connection section and the second load connection, and a housing, wherein the shunt resistor region has an ohmic resistance with a temperature coefficient having an absolute value of less than 0.00002/K at a temperature of 20° C., wherein the connection lug in the region of the second load connection section is electrically conductively connected to a first section of the metallization layer by a first cohesive connection, the method comprising:
   determining a voltage dropped across the shunt resistor region; and
   determining the current flowing through the load connection based on the voltage dropped and based on the ohmic resistance of the shunt resistor region.

19. The method of claim 18, wherein the shunt resistor region has a resistivity of at least $40*10^{-8}$ Ω·m at a temperature of 20° C.

* * * * *